United States Patent
Reineke et al.

[11] Patent Number: 6,081,061
[45] Date of Patent: Jun. 27, 2000

[54] METHOD AND DEVICE FOR CHARGING AND DISCHARGING A PIEZOELECTRIC ELEMENT

[75] Inventors: Joerg Reineke; Alexander Hock, both of Stuttgart, Germany

[73] Assignee: Robert Bosch GmbH, Stuttgart, Germany

[21] Appl. No.: 09/054,167

[22] Filed: Apr. 2, 1998

[30] Foreign Application Priority Data

Apr. 9, 1997 [DE] Germany .................. 197 14 616

[51] Int. Cl.[7] ............................................. B06B 1/06
[52] U.S. Cl. ............................... 310/316.03; 310/317
[58] Field of Search .................................. 310/316–319

[56] References Cited

U.S. PATENT DOCUMENTS

| | | | |
|---|---|---|---|
| 4,498,089 | 2/1985 | Scardovi | 310/317 |
| 4,595,854 | 6/1986 | Yano et al. | 310/317 |
| 4,688,536 | 8/1987 | Mitsuyasu et al. | 310/317 |
| 5,095,256 | 3/1992 | Ueyama et al. | 310/316 |
| 5,130,598 | 7/1992 | Verheyen et al. | 310/316 |
| 5,214,340 | 5/1993 | Suzuki | 310/316 |
| 5,350,962 | 9/1994 | Sakaida et al. | 310/316 |
| 5,387,834 | 2/1995 | Suzuki | 310/317 |
| 5,425,343 | 6/1995 | Akaki et al. | 310/317 |
| 5,477,831 | 12/1995 | Akaki et al. | 310/316 |

FOREIGN PATENT DOCUMENTS

| | | | |
|---|---|---|---|
| 0 371 469 | 6/1990 | European Pat. Off. | H01L 41/08 |
| 0 379 182 | 7/1990 | European Pat. Off. | H01L 41/08 |
| 0 464 443 | 1/1992 | European Pat. Off. | F02D 41/40 |
| 44 35 832 | 4/1996 | Germany | H02M 3/10 |
| 4-071859 | 3/1992 | Japan | B41J 2/30 |
| 4-166641 | 6/1992 | Japan | 310/317 |

Primary Examiner—Thomas M. Dougherty
Attorney, Agent, or Firm—Kenyon & Kenyon

[57] ABSTRACT

A method and a device for charging and discharging a piezoelectric element. Both the charging and the discharging taking place, at least partially, via an element having an inductive effect on the charge and on the discharge current. The charge current and the discharge current, at least partially, are conducted via the same element having an inductive effect. It is therefore possible in a simple manner to carry out efficient charging and discharging of piezoelectric elements even in cramped conditions.

28 Claims, 6 Drawing Sheets

METHOD AND DEVICE FOR CHARGING AND DISCHARGING A PIEZOELECTRIC ELEMENT

FIELD OF THE INVENTION

The present invention relates to method and device for charging and discharging a piezoelectric element, where the piezoelectric element is both charged and discharged, at least partially, via an element having an inductive effect on a charge current and a discharge current.

BACKGROUND INFORMATION

Piezoelectric elements are especially (but not exclusively) used as actuators or control elements. Piezoelectric elements can be so used because they are known to contract or expand in response to the voltage applied to them.

The practical realization of control elements using piezoelectric elements has proven particularly advantageous when a particular control element has a task of a rapid execution and/or frequent movements.

It is also advantageous to use piezoelectric elements, for example, as a control element in fuel injection nozzles for internal combustion engines. European Patent Application Nos. 0 371 469 and 0 379 182 describe such application.

Piezoelectric elements are capacitive consumers, which, as described above, contract or expand in response to a particular charging state or in response to their voltage rise or the voltage being applied to them.

Two conventional principles are known for charging and discharging a piezoelectric element. In particular, charging and discharging of the piezoelectric element via an ohmic resistor and charging and discharging of the piezoelectric element via a coil. The ohmic resistor and the coil limit the charge current that occurs during charging and the discharge current that occurs during discharging.

The first conventional arrangement for charging and discharging a piezoelectric element 101 via an ohmic resistor is illustrated in FIG. 9.

The piezoelectric element 101 is connected to a charging transistor 102 and to a discharging transistor 103.

Charging transistor 102 is driven by a charging amplifier 104 and, in a connected-through state, charging transistor 102 connects piezoelectric element 101 to a positive supply voltage; discharging transistor 103 is driven by a discharging amplifier 105 and, in the connected-through state, discharging transistor 103 connects piezoelectric element 101 to ground.

In the connected-through state, a charge current flows through the charging transistor 102 for charging piezoelectric element 101. With the increasing charge of piezoelectric element 101, the voltage arising on piezoelectric element 101 rises, causing its external dimensions to also change, correspondingly. The blocking of charging transistor 102, i.e., interrupting or ending the charging process, results in the charge stored in piezoelectric element 101 or the voltage arising at piezoelectric element 101 as a result, and thus the active external dimensions of piezoelectric element 101 are maintained essentially unchanged.

In the connected-through state, a discharge current flows through discharge transistor 103 for discharging piezoelectric element 101. As piezoelectric element 101 is increasingly discharged, the voltage at piezoelectric element 101 drops, and its external dimensions also change, correspondingly. The blocking of discharging transistor 103, i.e., interrupting or ending the discharging process, results in the charge still being stored in piezoelectric element 101 or the voltage at piezoelectric element 101 as a result, and thus the active external dimensions of piezoelectric element 101 are maintained essentially unchanged.

Charging transistor 102 and discharging transistor 103 act as controllable ohmic resistors for the charge current and for the discharge current, respectively. The controllability of the charge current and of the discharge current makes it possible to exactly control the charging process and discharging process. However, the charge current flowing through charging transistor 102 and the discharge current flowing through discharging transistor 103, in this case, produce substantial power losses. The energy loss occurring in the transistors is at least twice as high, per charge-discharge cycle, as the energy stored in piezoelectric element 101. This high energy loss causes a very extensive heating of charging transistor 102 and discharging transistor 103, which is a considerably disadvantageous.

A second conventional variant described above for charging and discharging the piezoelectric element (i.e., charging and discharging via a coil) is also utilized, which is illustrated in FIG. 10.

The piezoelectric element to be charged or discharged, designated in FIG. 10 with the reference numeral 201, is a component part of a charging circuit which can be closed by a charging switch 202 and of a discharging circuit which can be closed by a discharging switch 206, the charging circuit is a series circuit including charging switch 202, a diode 203, a charging coil 204, piezoelectric element 201 and a voltage source 205. A discharging circuit is a series circuit including discharging switch 206, a diode 207, a discharging coil 208, and piezoelectric element 201.

Diode 203 of the charging circuit prevents a current discharging the piezoelectric element from flowing in the charging circuit. Diode 203 and charging switch 202 can be produced together as a semiconductor switch.

Diode 207 of the discharging circuit prevents a current charging the piezoelectric element from flowing in the discharging circuit. Diode 207 and charging switch 206, similarly to diode 203 and charging switch 202, can be produced together as a semiconductor switch.

If charging switch 202 (which is usually open) is closed, a charge current flows in the charging circuit charging piezoelectric element 201. After piezoelectric element 201 is charged, there is essentially no change in the charge stored in piezoelectric element 201 or in the voltage arising at piezoelectric element 201, and thus also in its active external dimensions.

If discharging switch 202 (which is usually open) is closed, a discharge current flows in the discharging circuit discharging piezoelectric element 201. After piezoelectric element 201 is discharged, there is essentially no change in its charge state or in the voltage arising at piezoelectric element 201, and, therefore, also in its active external dimensions.

Charging coil 204 and discharging coil 206 represent an element having an inductive effect on the charge current or the discharge current, respectively. Charging coil 204 and piezoelectric element 201, as well as discharging coil 206 and piezoelectric element 201, constitute an LC-series resonant circuit during the charging and discharging of a piezoelectric element.

Circuits described above with reference to FIG. 10 and methods for charging and discharging the piezoelectric elements using such circuits are described in European Patent Application Nos. 0 371 469 and 0 379 182.

With the circuits described above with reference to FIG. 10, neither the charging circuit nor the discharging circuit has any significant ohmic resistors, and the thermal energy produced by the charging and discharging of the piezoelectric element (and by the flow of the charge current and the discharge current through ohmic resistors) is extremely small.

However, to practically produce such circuits, particularly due to a considerable size of charging coil 204 and discharging coil 208, a relatively large amount of space is required. Thus, in certain cases, the charging and discharging of piezoelectric elements via an element having essentially an inductive effect on the charge and discharge current is not easily achievable or not even possible.

One of the objects of the present invention is to efficiently charge and discharge the piezoelectric elements, even in cramped spaces and conditions.

SUMMARY OF THE INVENTION

According to the present invention, the charge current and the discharge current are at least partially conducted through the same element having an inductive effect. In addition, at least one element having an inductive effect is arranged such that both the charge current and the discharge current can be conducted therethrough.

Because the piezoelectric element is at least partially charged and discharged via an element that has an inductive effect on the charge or discharge current (e.g., via a coil or an element acting as a coil), it is possible to maintain the charge current path and the discharge current path essentially free of electrical loads. Accordingly, a very small amount of energy is consumed because the power loss is minor and the energy dissipated in the discharge of the piezoelectric element can be returned to the voltage source or can be directed into a capacitor. Furthermore, the heating of the circuit during the charging and discharging can be maintained extremely low. As a result, individual component parts (including a power supply) can be designed for relatively small power outputs, and the cooling measures can either be entirely eliminated or can be substantially restricted.

Conducting the charge current and the discharge current through the same element having an inductive effect (e.g., conducting the charge current and the discharge current via the same coil or via the same element functioning as a coil) allows the number of component parts to be reduced. In particular, the number of elements having an inductive effect can be reduced, which is clearly advantageous because the size of these elements is substantially large.

Accordingly, it is possible to efficiently carry out the charging and discharging of piezoelectric elements in cramped and restricted conditions. Furthermore, the device according to the present invention is simpler and less expensive to manufacture than the conventional devices.

DETAILED DESCRIPTION

The piezoelectric elements, whose charging and discharging is described in greater detail below, can be used, for example, as control elements in fuel injection nozzles (particularly in so-called common rail injectors) of internal combustion engines. There is, however, no limitation placed on such use of piezoelectric elements. The piezoelectric elements can basically be used in any devices for any purposes.

It is assumed that the piezoelectric elements expand in response to charging and contract in response to discharging. The device and method according to the present invention can also be used when the piezoelectric elements contract in response to discharging, and expand in response to charging.

Figure 1:
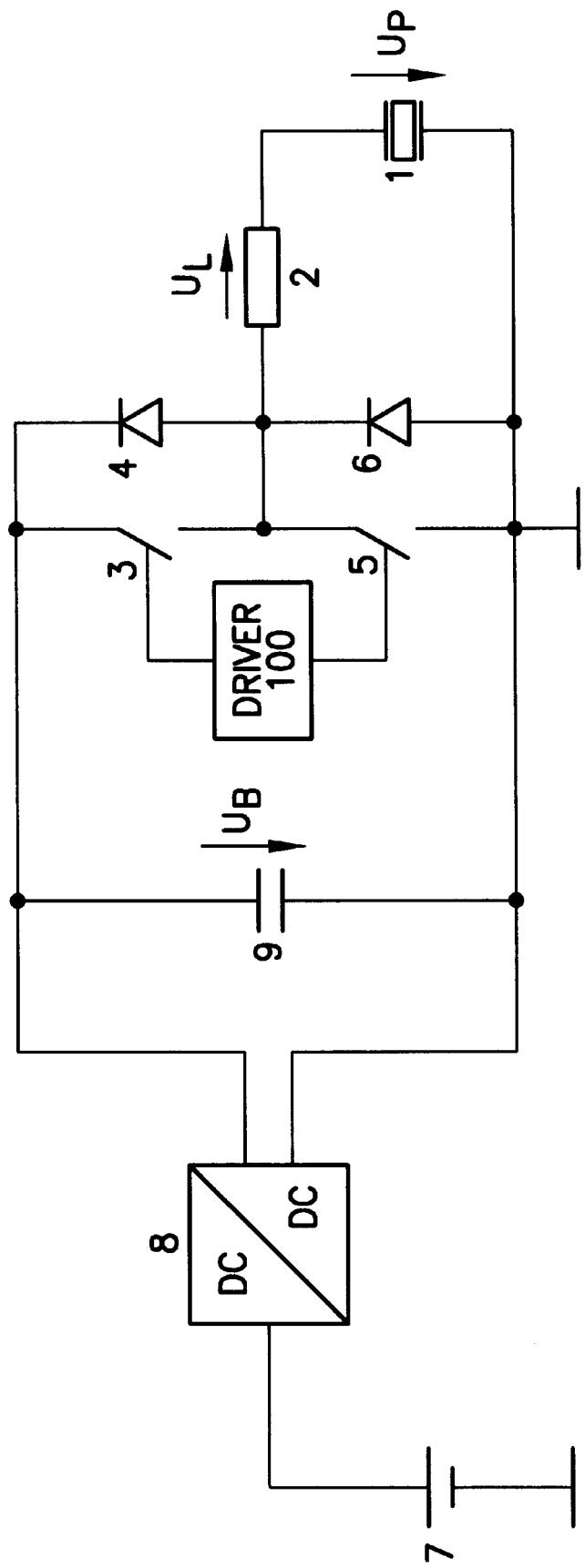
FIG. 1 shows a circuit according to the present invention which is suitable for charging and discharging of a piezoelectric element using a method according to the present invention.

A first exemplary embodiment of the device and method according to the present invention for charging and discharging a piezoelectric element is shown in FIG. 1.

The piezoelectric element to be charged is illustrated in FIG. 1 with the reference numeral 1.

As can be clearly seen in FIG. 1, one of the terminals of piezoelectric element 1 is permanently connected to ground (i.e., connected to a first pole of a voltage source). The other terminal of piezoelectric element 1 is connected (via coil 2 and a parallel circuit including a charging switch 3 and a diode 4) to a second pole of the voltage source and (via coil 2 and a parallel circuit including a discharging switch 5 and a diode 6) to a first pole of the voltage source. A driver 100 drives charging switch 3 and discharging switch 6.

The voltage source includes a battery 7 (e.g., an automobile battery), a downstream DC voltage transformer 8, and a downstream capacitor 9 acting as buffer capacitor. With this arrangement, the battery voltage (e.g., 12 V) is transformed into virtually any other DC voltage and is made available as a supply voltage.

In the first embodiment, piezoelectric element 1 is charged and discharged in a switch mode (or in a timed cycle). As such, charging switch 3 and discharging switch 5 are repeatedly opened and closed during the charging and discharging processes.

Figure 2:
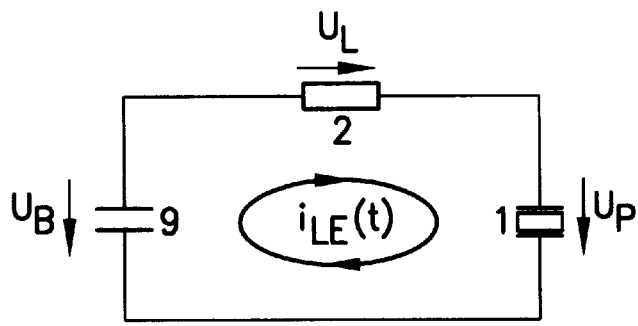
FIG. 2 shows an exemplary illustration summarizing the conditions present during a first charging phase (i.e., a charging switch is closed) in the circuit of FIG. 1.
Figure 3:
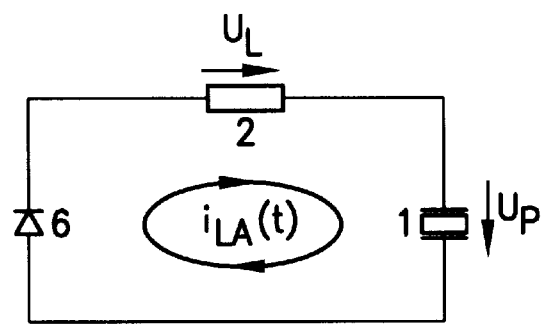
FIG. 3 shows an exemplary illustration summarizing the conditions present during a second charging phase (i.e., the charging switch is open again) in the circuit of FIG. 1.
Figure 4:
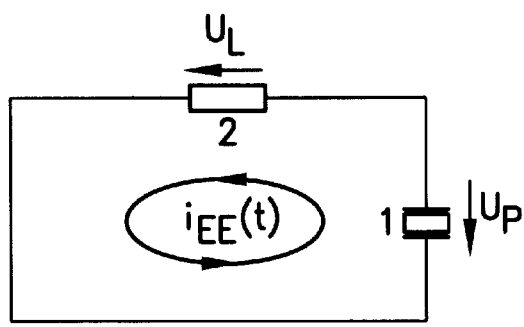
FIG. 4 shows an exemplary illustration summarizing the conditions present during a first discharging phase (i.e., a discharging switch is closed) in the circuit of FIG. 1.
Figure 5:
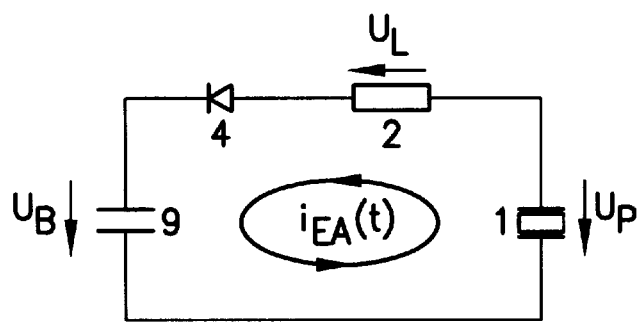
FIG. 5 shows an exemplary illustration summarizing the conditions present during a second discharging phase (i.e., the discharging switch is open again) in the circuit of FIG. 1.

The conditions arising in this context are explained with reference to FIGS. 2–5. FIGS. 2 and 3 illustrate the charging of piezoelectric element 1. FIGS. 4 and 5 illustrate the discharging of piezoelectric element 1.

Charging switch 3 and discharging switch 5 are opened, if (and as long) as no charging or discharging of piezoelectric element 1 is occurring. In this state, the circuit shown in FIG. 1 is in a stationary condition. As such, piezoelectric element 1 maintains its charge essentially unchanged, and no current is flowing.

As piezoelectric element 1 begins to be charged, charging switch 3 is repeatedly opened and closed, while discharging switch 5 remains open.

When charging switch 3 is closed, the conditions shown in FIG. 2 arise. As such, a closed circuit is formed as a series circuit including piezoelectric element 1, capacitor 9, and coil 2, in which a current $i_{LE}(t)$ flows as indicated by the arrow in FIG. 2. This current flow causes energy to be stored in coil 2. The energy flow into coil 2 is caused by the positive potential difference between capacitor 9 and piezoelectric element 1.

When charging switch 3 is immediately opened (e.g., within several microseconds) after it is closed, the conditions indicated in FIG. 3 arise. As such, a closed circuit is formed as a series circuit including piezoelectric element 1, diode 6, and coil 2, in which a current $i_{LA}(t)$ flows as indicated by the arrow in FIG. 3. This energy flow causes all of the energy stored in coil 2 to flow into piezoelectric element 1. The voltage arising at piezoelectric element 1 (as well as its external dimensions) increase in response to the energy supply to piezoelectric element 1. After the energy transfer is completed from coil 2 to piezoelectric element 1, the above-described stationary condition of the circuit as shown in FIG. 1 is again established.

At that moment, previously, or at a later point (depending on the desired temporal progression of the charging process), charging switch 3 is closed and opened once again, and the processes described above is repeated. Through the repeated closing and opening of charging switch 3, the energy stored in piezoelectric element 1 increases (the energy stored in piezoelectric element 1 and the newly supplied energy being equal). Accordingly, the voltage arising on piezoelectric element 1, as well as its external dimensions, increase.

If the above-described closing and opening of charging switch 3 is repeated multiple times, the voltage arising on (as well as the dimensions of) piezoelectric element 1 increase step by step (also see FIG. 6, as described below). Thus, the piezoelectric element is charged in an progressive manner.

If charging switch 3 has been closed and opened a preselected number of times and/or piezoelectric element 1 has attained the desired charge condition, piezoelectric element 1 ceases to be charged by maintaining charging switch 3 open. Thus, the piezoelectric element is discharged in a progressive manner.

If piezoelectric element 1 is to be discharged, this is accomplished through repeated closing and opening of discharging switch 5. Thus, charging switch 3 remains open.

Upon the closing of discharging switch 5, the conditions indicated in FIG. 4 arise. As such, a closed circuit is formed as a series circuit including piezoelectric element 1 and coil 2, in which a current $i_{EE}(t)$ flows as indicated by the arrow in FIG. 4. This energy flow causes the energy stored in piezoelectric element 1 (at least a portion thereof) to be transferred into coil 2. The voltage arising on piezoelectric element 1, as well as its external dimensions, decrease in response to the energy transfer from the piezoelectric element to coil 2.

When discharging switch 5 is opened immediately (e.g., within several microseconds) after it is closed, the conditions indicated in FIG. 5 arise. As such, a closed circuit is formed as a series circuit including piezoelectric element 1, capacitor 9, diode 4, and coil 2, in which a current $i_{EA}(t)$ flows as indicated by the arrow in FIG. 5. This energy flow causes the energy stored in coil 2 to flow back, in its entirety, into capacitor 9. After the energy transfer is completed from coil 2 to capacitor 9, the above-described stationary condition of the circuit, as shown in FIG. 1, is again attained.

At that moment, previously, or at a later point (depending on the desired temporal progression of the discharging process), discharging switch 5 is closed and opened once again, and the processes described above is repeated. Through the repeated closing and opening of discharging switch 5, the energy stored in piezoelectric element 1 decreases. Accordingly, the voltage arising on piezoelectric element 1 as well as its external dimensions, also decrease.

Figure 6:
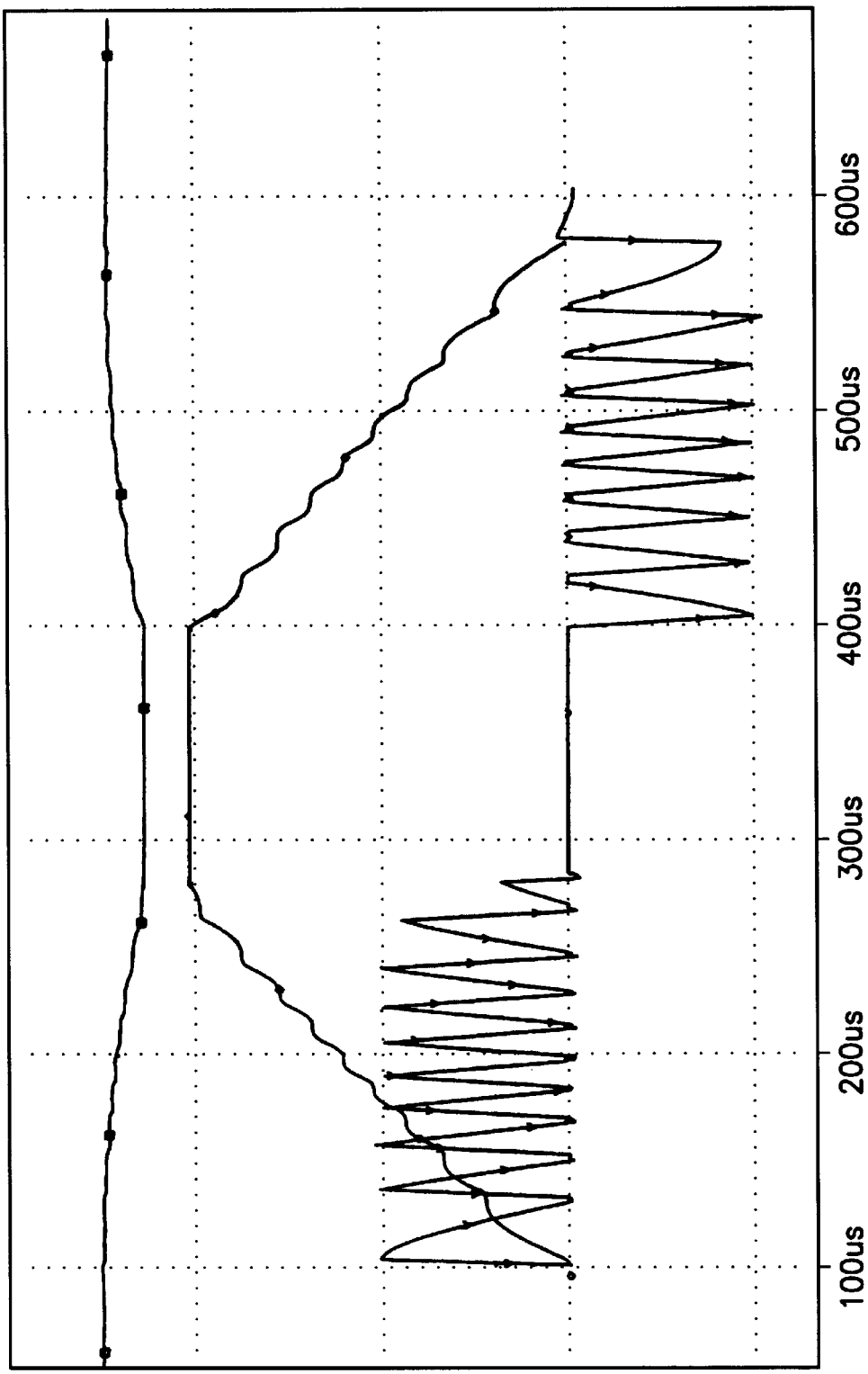
FIG. 6 shows a graphical representation of the voltage curves and current curves present during an operation of the circuit of FIG. 1.

If the described closing and opening of discharging switch 5 is repeated multiple times, the voltage arising on (as well as the dimensions of) the piezoelectric element decrease step by step (as shown in FIG. 6).

If discharging switch 3 has been closed and opened a preselected number of times and/or the piezoelectric element has attained the desired discharge condition, piezoelectric element 1 ceases to be discharged by leaving discharging switch 5 open.

If the circuit shown in FIG. 1 is operated, i.e., if the charging and discharging of piezoelectric element 1 is accomplished as described above, then the current and voltage curves arise as illustrated in FIG. 6.

The curves illustrated in FIG. 6 are provided with symbols representing measurement dimensions, which are as follows:

☐ voltage $U_B$ arising in capacitor 9,

◇ the voltage arising on piezoelectric element 1, and

V the current flowing through coil 2.

The current and voltage curves shown in FIG. 6 illustrate the charging process (in the area of approximately 100–300 µs on the time scale) and the discharging process (in the area of approximately 400–600 µs on the time scale). These curves correspond to the function and mode of operation of the circuit shown in FIG. 1.

As shown in FIG. 6, the voltage arising on piezoelectric element 1 exhibits a homogenous curve which is easy to control.

At the same time, the circuit with which the charging and discharging of the piezoelectric element is effected, i.e., the circuit as shown in FIG. 1 is provided with the greatest conceivable simplicity and with optimal efficiency. In particular, three factors contribute to this advantage:

1) the charging and discharging take place via the same coil (e.g., coil 2),
2) the energy loss through heat production in the ohmic resistors is insignificant, and
3) the energy stored in the piezoelectric element is essentially sent back (in its entirety) to capacitor 9 to be stored and is thus available for immediate reuse.

The above-described first point makes it possible to minimize the number of component parts, in particular the number of originally relatively large coils. The second and third points make it possible to design battery 7 and DC voltage transformer 8 for only relatively small capacities.

With the above-described points (whether alone or in combination), it is possible to accommodate, in the smallest possible space, the circuits provided for charging and discharging piezoelectric elements and to minimize their production and operation costs.

Using the method described above for charging and discharging piezoelectric elements, and with the circuit suitable for carrying out this method, it is possible for a multiplicity of piezoelectric elements to be charged and discharged in sequence, instead of only one piezoelectric element.

Figure 7:
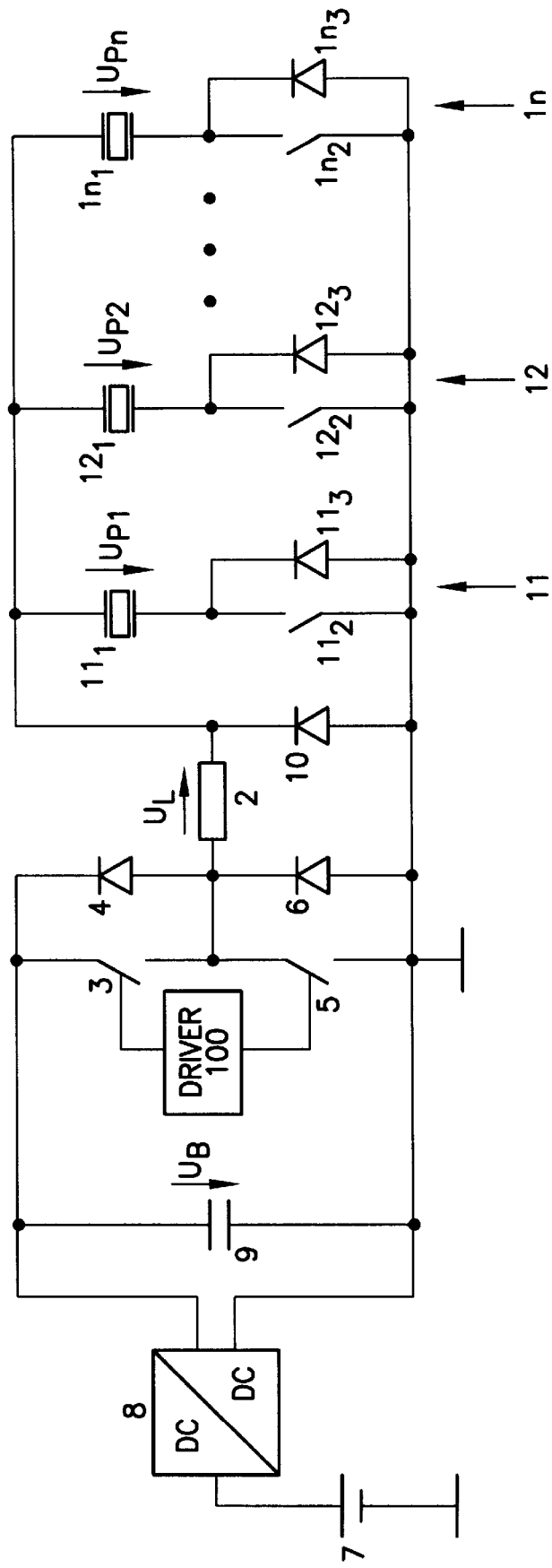
FIG. 7 shows a circuit according to the present invention for sequential charging and discharging of a plurality of piezoelectric elements using the method according to the present invention.

A circuit which enables such charging and discharging is shown in FIG. 7.

The circuit illustrated in FIG. 7 is based on the circuit shown in FIG. 1. The corresponding elements are indicated with the same reference numerals. Piezoelectric element 1 (as shown in FIG. 1) is replaced with a parallel circuit including a further diode 10 and a multiplicity (n) of piezoelectric branches 11, 12, ..., 1n. Each piezoelectric branch is a series circuit including a piezoelectric element $11_1, 12_1, \ldots 1n_1$, and a parallel circuit including a selection switch $11_2, 12_2, \ldots 1n_2$ and a diode $11_3, 12_3, \ldots, 1n_3$.

Diode 10 prevents negative voltages from occurring in the piezoelectric elements, since the piezoelectric elements can be destroyed as a result, under certain circumstances.

The selection switch-diode pairs, arranged in parallel in the individual piezoelectric branches, i.e., selection switch $11_2$ and diode $11_3$ in piezoelectric branch 11, selection switch $12_2$ and diode $12_3$ in piezoelectric branch 12, and selection switch $1n_2$ and diode $1n_3$ in piezoelectric branch 1n, can be realized using electronic switches having parasitical diodes such as MOS-FETs.

The charging and discharging of piezoelectric elements $11_1, 12_1, \ldots 1n_1$ take place substantially in the same way as the charging and discharging of piezoelectric element 1 shown in FIG. 1. As such, for charging, charging switch 3 is repeatedly closed and opened, and for discharging, discharging switch 5 is repeatedly closed and opened.

Which piezoelectric element(s) $11_1, 12_1, \ldots 1n_1$ is (are) to be charged in the repeated closing and opening of charging switch 3 is determined by selection switches $11_2, 12_2 \ldots 1n_2$. In each case, all piezoelectric elements $11_1, 12_1 \ldots 1n_1$ are charged whose selection switches $11_2, 12_2 \ldots 1n_2$ are closed during the repeated closing and opening of charging switch 3.

The selection of piezoelectric elements $11_1, 12_1 \ldots 1n_1$ to be charged by closing the assigned selection switches $11_2, 12_2 \ldots 1n_2$, and canceling of the selection through opening the respective switch are generally accomplished externally to the charging process; in certain cases, e.g., if a plurality of piezoelectric elements $11_1, 12_1 \ldots 1n_1$ are to be charged simultaneously with varying strengths, the opening and closing of selection switches $11_2, 12_2, \ldots 1n_2$ can also take place during the charging process.

The processes arising during the charging of selected piezoelectric elements $11_1, 12_1 \ldots 1n_1$ are substantially identical to the processes arising in the circuit shown in FIG. 1. FIGS. 2 and 3 and the explanations in reference thereto also apply. The only difference is that it is not piezoelectric element 1 but rather one or a plurality of piezoelectric elements $11_1, 12_1 \ldots 1n_1$ which are charged.

The discharging of piezoelectric elements $11_1, 12_1 \ldots 1n_1$ takes place independent of the position of the assigned selection switches $11_2, 12_2 \ldots 1n_2$, because the discharge current causing the discharge of the piezoelectric elements can flow via diodes $11_3, 12_3 \ldots 1n_3$ assigned to the respective piezoelectric elements. Through the discharging process, therefore, all of completely or partially charged piezoelectric elements $11_1, 12_1 \ldots 1n_1$ are discharged.

The processes arising during the discharging of piezoelectric elements $11_1, 12_1 \ldots 1n_1$ are substantially identical to the processes of the circuit shown in FIG. 1. FIGS. 4 and 5 and the explanations with reference thereto are also applicable. The only difference is that it is not only piezoelectric element 1, but rather one or a plurality of piezoelectric elements $11_1, 12_1 \ldots 1n_1$ which are discharged.

Figure 8:
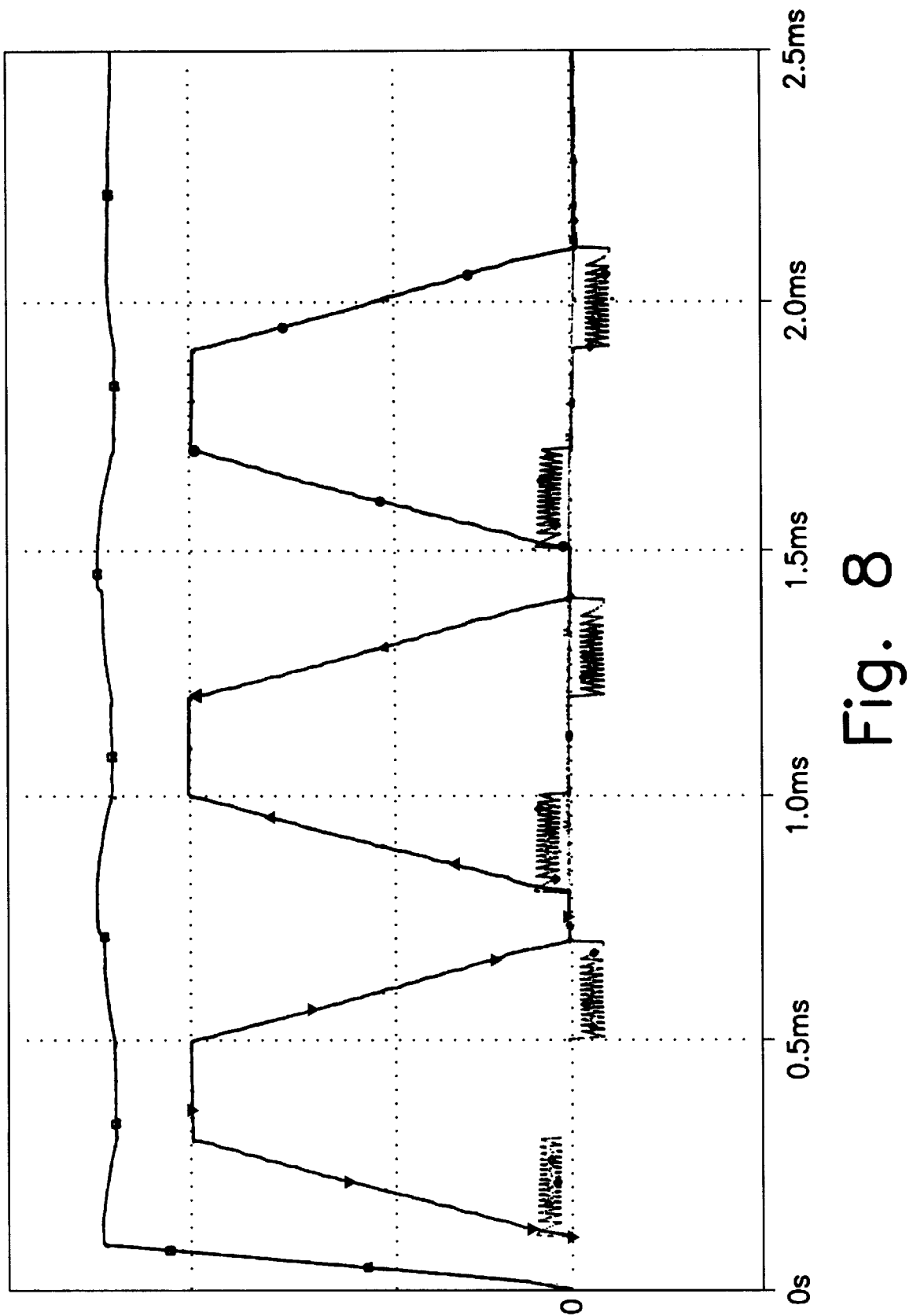
FIG. 8 shows a graphical representation of the voltage curves and current curves present during an operation of the circuit of FIG. 7.
Figure 9:
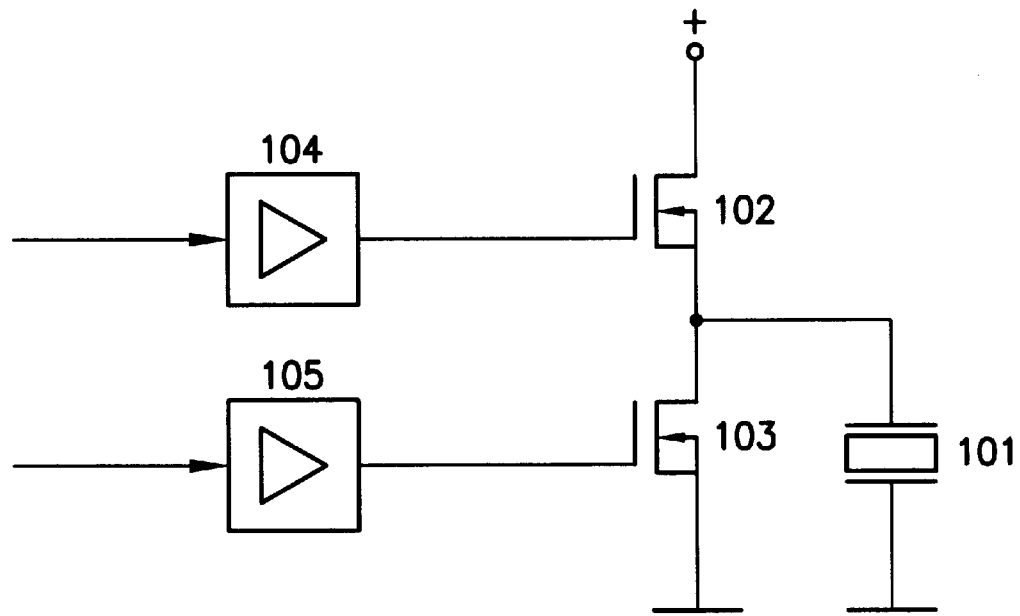
FIG. 9 shows a conventional circuit for charging and discharging the piezoelectric element via elements acting as ohmic resistors for the charge current and for the discharge current.
Figure 10:
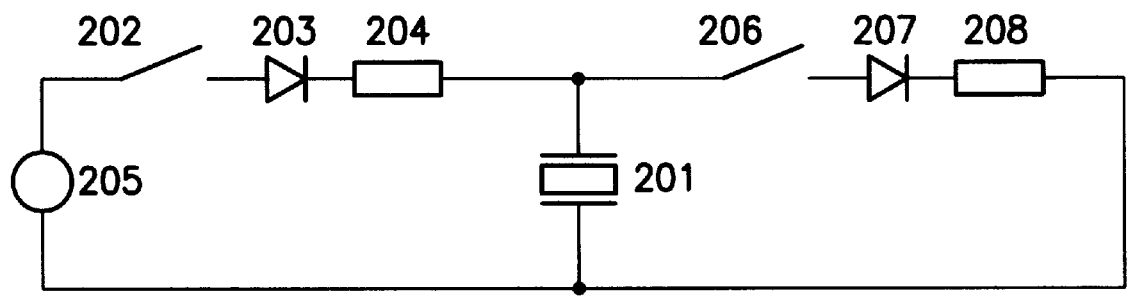
FIG. 10 shows a conventional circuit for charging and discharging the piezoelectric element via elements acting as coils for the charge current and for the discharge current.

If the circuit in shown FIG. 7 is operated such that piezoelectric elements $11_1, 12_1 \ldots 1n_1$ are sequentially charged and discharged (i.e., one by one) as described above, then the current and voltage curves indicated in FIG. 8 occur.

The curves shown in FIG. 8 are furnished with their symbols representing measurement dimensions, as follows:

□ the voltage $U_B$ arising on capacitor 9,

◇ the current flowing through coil 2,

▽ the voltage arising on piezoelectric element $11_1$,

△ the voltage arising on piezoelectric element $12_1$, and

○ the voltage arising on piezoelectric element $1n_1$.

The current and voltage curves shown in FIG. 8 illustrate the charging and discharging process of piezoelectric element $11_1$ (in the area of approximately 0.1–0.7 ms on the time scale), the charging and discharging process of piezoelectric element $12_1$ (in the area of approximately 0.8–1.4 ms on the time scale), and the charging and discharging process of piezoelectric element $1n_1$ (in the area of approximately 1.5–2.1 ms on the time scale). These curves correspond to the function and mode of operation of the circuit shown in FIG. 7.

As clearly seen from FIG. 8, the voltages arising on the piezoelectric elements exhibit a virtually linear curve, which is recognized to be easy to control.

At the same time, the circuit with which the charging and discharging of the piezoelectric element is actuated, i.e., the circuit shown in FIG. 7 is constructed with the greatest simplicity and with optimal efficiency. A contributing factor, as with the circuit shown in FIG. 1, is that the charging and discharging take place via the same coil (namely, coil 2), that the energy loss through the production of heat in the ohmic resistors is inconsequentially slight, and that the energy stored in the piezoelectric element is essentially sent back (in its entirety) to capacitor 9 to be stored and is thus available for immediate reuse.

Thus, it is possible to minimize the number of component parts, in particular the number of originally relatively large coils. It is also possible to design battery 7 and DC voltage transformer 8 for only relatively small capacities.

With all or some of these advantages, it is possible to accommodate (in the smallest possible space) the circuits discussed above (e.g., the circuit shown in FIG. 7) for charging and discharging piezoelectric elements, and to minimize their production and operation costs.

In the exemplary embodiments described above, a coil was used in each case as the element having an inductive effect. The coil (with an accordingly modified circuit design and circuit operations) can also be replaced with other elements having an inductive effect (e.g., transducers, transformers, etc.).

There is also no limitation on carrying out the charging and discharging in a switch mode (or in a timed cycle), as described above. The charging and/or discharging, as an alternative or as a supplement, can be carried out in another manner. For example, it can be possible to carry out the charging and/or discharging completely or partially via one or a plurality of charging or discharging circuits acting as resonant circuits.

To summarize, with the device and method according to the present invention, it is possible, in a simple and elegant manner, to carry out efficient charging and discharging of piezoelectric elements even under cramped conditions.

What is claimed is:

1. A method for charging and discharging a piezoelectric element, comprising the steps of:
   at least partially charging the piezoelectric element via a unit in a progressive manner;
   at least partially discharging the piezoelectric element via the unit, the unit having an inductive effect on a charge current and on a discharge current; and
   at least partially conducting the charge current and the discharge current via the unit.

2. The method according to claim 1, wherein the unit includes a coil.

3. The method according to claim 2, wherein the coil is connected in series to the piezoelectric element.

4. The method according to claim 1, wherein the step of at least partially charging the piezoelectric element includes repeatedly closing and opening a charging switch to progressively charge the piezoelectric element, the charging switch being closed to store energy in the unit, the charging switch being opened to release the energy stored in the unit to the piezoelectric element.

5. The method according to claim 1, wherein the piezoelectric element is protected from negative potentials before the piezoelectric element is charged.

6. The method according to claim 1, wherein the step of at least partially charging includes at least partially charging the piezoelectric element in a step-wise manner.

7. A method for charging and discharging a piezoelectric element, comprising the steps of:
   at least partially charging the piezoelectric element via a unit in a progressive manner;
   at least partially discharging the piezoelectric element via the unit, the unit having an inductive effect on a charge current and on a discharge current; and
   at least partially conducting the charge current and the discharge current via the unit;
   wherein the unit charges and discharges a plurality of piezoelectric elements, the plurality of piezoelectric elements being provided in branches connected in parallel.

8. The method according to claim 5, further comprising the step of:
   selecting the piezoelectric element for charging using assigned selection switches.

9. The method according to claim 7, wherein the step of at least partially charging includes the step of at least partially charging the piezoelectric element in a progressive manner.

10. The method according to claim 9, where the step of at least partially charging includes the step of at least partially charging the piezoelectric element in a step-wise manner.

11. The method according to claim 7, wherein the step of at least partially discharging includes the step of at least partially discharging the piezoelectric element in a progressive manner.

12. The method according to claim 9, where the step of at least partially discharging includes the step of at least partially discharging the piezoelectric element in a step-wise manner.

13. A device for charging and discharging a piezoelectric element, comprising:
    at least one unit coupled to the piezoelectric element, the at least one unit at least partially charging and discharging the piezoelectric element, the at least one unit having an inductive effect on a charge current and on a discharge current; and
    a charging switch coupled to the at least one unit; and
    a driver driving the charging switch, the driver repeatedly closing and opening the charging switch to progressively charge the piezoelectric element, the driver closing the charging switch to store energy in the at least one unit and opening the charging switch to release the energy stored in the at least one unit to the piezoelectric element;
    wherein the charge current and the discharge current are conducted through the at least one unit.

14. The device according to claim 13, wherein the at least one unit includes a coil.

15. The device according to claim 14, wherein the coil is connected in series to the piezoelectric element.

16. The device according to claim 13, wherein the piezoelectric element is protected from negative potentials before the piezoelectric element is charged.

17. A device for charging and discharging a piezoelectric element, comprising:
    at least one unit coupled to the piezoelectric element, the at least one unit at least partially charging and discharging the piezoelectric element, the at least one unit having an inductive effect on a charge current and on a discharge current; and
    a discharging switch coupled to the at least one unit; and
    a driver driving the discharging switch, the driver repeatedly closing and opening the discharging switch to progressively discharge the piezoelectric element, the driver closing the discharging switch to transfer energy stored in the piezoelectric element to the at least one unit, the driver opening the discharging switch to release the energy stored in the at least one unit.

18. The device according to claim 17, further comprising:
    a buffer capacitor coupled to the at least one unit and situated downstream from a voltage supply source, wherein the energy is released from the at least one unit to the buffer capacitor.

19. A device for charging and discharging a piezoelectric element, comprising:
    at least one unit coupled to a plurality of piezoelectric elements, the plurality of piezoelectric elements being provided in branches connected in parallel, the at least one unit at least partially charging and discharging at least one of the plurality of piezoelectric elements, the at least one unit having an inductive effect on a charge current and on a discharge current; and
    a charging switch coupled to the at least one unit; and
    a driver driving the charging switch, the driver repeatedly closing and opening the charging switch to progressively charge the at least one of the plurality of piezoelectric elements.

20. The device according to claim 19, further comprising:
    preassigned selection switches coupled to each of the plurality of piezoelectric elements, for selecting the piezoelectric element to be charged.

21. A method for charging and discharging a piezoelectric element, comprising the steps of:
    at least partially charging the piezoelectric element via a unit;
    at least partially discharging the piezoelectric element via the unit in a progressive manner, the unit having an inductive effect on a charge current and on a discharge current; and at least partially conducting the charge current and the discharge current via the unit.

22. The method according to claim 21, wherein the unit includes a coil.

23. The method according to claim 21, wherein the step of at least partially discharging the piezoelectric element includes repeatedly closing and opening a discharging switch to progressively discharge the piezoelectric element, the discharging switch being closed to transfer energy stored in the piezoelectric element to the unit, the discharging switch being opened to release the energy stored in the unit.

24. The method according to claim 5, wherein the energy is released from the unit to a buffer capacitor, the buffer capacitor being situated downstream from a voltage supply source.

25. The method according to claim 21, wherein the step of at least partially discharging includes at least partially discharging the piezoelectric element in a step-wise manner.

26. The device according to claim 19, wherein the driver repeatedly closes and opens the charging switch to progressively charge the at least one of the plurality of piezoelectric elements in a step-wise manner.

27. A device for charging a piezoelectric element, comprising:

at least one unit coupled to a plurality of piezoelectric elements, the plurality of piezoelectric elements being provided in branches connected in parallel, the at least one unit at least partially charging and discharging at least one of the plurality of piezoelectric elements, the at least one unit having an inductive effect on a charge current and on a discharge current; and a discharging switch coupled to the at least one unit; and a driver driving the discharging switch, the driver repeatedly closing and opening the discharging switch to progressively discharge at least one of the plurality of piezoelectric elements.

28. The device according to claim 27, wherein the driver repeatedly closes and opens the discharging switch to progressively discharge the piezoelectric element is a step-wise manner.

* * * * *